United States Patent
Sakamoto et al.

(10) Patent No.: US 10,277,003 B2
(45) Date of Patent: Apr. 30, 2019

(54) LASER DEVICE AND LASER DEVICE MANUFACTURING METHOD

(71) Applicant: Fujikura Ltd., Tokyo (JP)

(72) Inventors: Shinichi Sakamoto, Sakura (JP); Yohei Kasai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/736,563

(22) PCT Filed: Feb. 26, 2016

(86) PCT No.: PCT/JP2016/055917
§ 371 (c)(1),
(2) Date: Dec. 14, 2017

(87) PCT Pub. No.: WO2016/203789
PCT Pub. Date: Dec. 22, 2016

(65) Prior Publication Data
US 2018/0175583 A1 Jun. 21, 2018

(30) Foreign Application Priority Data

Jun. 18, 2015 (JP) ................................. 2015-123319

(51) Int. Cl.
*H01S 5/022* (2006.01)
*H01L 23/36* (2006.01)
(Continued)

(52) U.S. Cl.
CPC .......... *H01S 5/02256* (2013.01); *H01L 23/36* (2013.01); *H01S 5/022* (2013.01);
(Continued)

(58) Field of Classification Search
CPC ............... H01L 23/367; H01S 5/02216; H01S 5/02236; H01S 5/02469; H01S 5/02272
See application file for complete search history.

(56) References Cited

U.S. PATENT DOCUMENTS 6,512,674 B1 * 1/2003 Tozawa ................. H01L 23/367
165/80.3
6,563,696 B1 5/2003 Harris et al.
(Continued)

FOREIGN PATENT DOCUMENTS

| CN | 103608985 A | 2/2014 |
| EP | 2 722 945 A1 | 4/2014 |

(Continued)

OTHER PUBLICATIONS

Notification of Reasons for Refusal dated Jan. 4, 2017, issued in counterpart Japanese Patent Application No. 2015-123319, w/English translation (11 pages).
(Continued)

*Primary Examiner* — Michael Carter
(74) *Attorney, Agent, or Firm* — Westerman, Hattori, Daniels & Adrian, LLP

(57) ABSTRACT

In a laser device 1 in which a laser module 2 is mounted on a heat sink 3, a base plate 20 of the laser module 2 is fixed onto a mounting surface 3s of the heat sink 3 in such a manner that a peripheral part 20b is fixed to the heat sink 3 with screws. The elastic force of the base plate 20 causes stress in the direction toward the mounting surface 3s on the central part 20a of the base plate 20 surrounded by the peripheral part 20b.

9 Claims, 7 Drawing Sheets

(51) Int. Cl.
*H01S 5/024* (2006.01)
*H01S 5/02* (2006.01)
(52) U.S. Cl.
CPC ............ *H01S 5/024* (2013.01); *H01S 5/0207* (2013.01); *H01S 5/02236* (2013.01); *H01S 5/02268* (2013.01); *H01S 5/02272* (2013.01); *H01S 5/02469* (2013.01)

(56) References Cited

U.S. PATENT DOCUMENTS

| | | | | |
|---|---|---|---|---|
| 9,158,078 | B2* | 10/2015 | Toyohara | H01S 5/02272 |
| 2003/0142712 | A1* | 7/2003 | Ikeda | H01S 5/02415 |
| | | | | 372/36 |
| 2004/0066814 | A1 | 4/2004 | Moriya et al. | |
| 2014/0097232 | A1 | 4/2014 | Toyohara et al. | |
| 2014/0105538 | A1 | 4/2014 | Toyohara et al. | |
| 2014/0286363 | A1 | 9/2014 | Kasai | |
| 2017/0153400 | A1* | 6/2017 | Kasai | G02B 6/42 |

FOREIGN PATENT DOCUMENTS

| | | | |
|---|---|---|---|
| JP | 42-424 | Y1 | 1/1967 |
| JP | 49-123270 | A | 11/1974 |
| JP | 49123270 | * | 11/1974 |
| JP | 6-82659 | A | 3/1994 |
| JP | 7-63943 | A | 3/1995 |
| JP | 2004-128291 | A | 4/2004 |
| JP | 2004-134642 | A | 4/2004 |
| JP | 2004-152897 | A | 5/2004 |
| JP | 2007-135123 | A | 5/2007 |
| JP | 2012-64785 | A | 3/2012 |
| JP | 2013-4751 | A | 1/2013 |
| JP | 2013-183074 | A | 9/2013 |
| JP | 2013-257362 | A | 12/2013 |
| WO | 2012/172855 | A1 | 12/2012 |

OTHER PUBLICATIONS

Decision of Refusal dated Oct. 3, 2017, issued in counterpart Japanese Patent Application No. 2015-123319, w/English translation (11 pages).
International Search Report dated May 24, 2016, issued in counterpart International Application No. PCT/JP2016/055917 (2 pages).
Extended (supplementary) European Search Report dated Jul. 3, 2018, issued in counterpart European Application No. 16811264.7. (8 pages).
Chinese Office Action dated Jan. 14, 2019, issued in counterpart Chinese Patent Application No. 201680029701.5.

* cited by examiner

LASER DEVICE AND LASER DEVICE MANUFACTURING METHOD

TECHNICAL FIELD

The present invention relates to a laser device and a laser device manufacturing method, which are suitable for minimizing a change in the power of emitted light over time.

BACKGROUND ART

A laser module that emits light emitted from laser diodes via an optical fiber is known as one type of laser modules used in laser devices. In this laser module, an optical fiber is brought from the inside to the outside of a housing, in which optical components such as laser diodes, mirrors, lenses, the optical fiber, and the like are arranged. Light rays emitted from the respective laser diodes are focused and then enter the optical fiber, and is emitted from the optical fiber outside the housing.

Since such a laser module tends to generate heat during use, the laser module is typically mounted on a heat sink when being included in a laser device. Patent Literature 1 below teaches such a laser device. A bottom plate of a laser module taught by this literature has a bottom surface formed to have at flat shape, and a mounting surface of the heat sink on which the laser module is mounted is also formed to have a flat shape.

[Patent Literature 1] JP2013-257362 A

SUMMARY OF INVENTION

Note that, in a laser module, a submount on which optical components are mounted is typically positioned on a bottom plate of a housing. The submount is made of a material having a relatively small coefficient of linear expansion such as aluminum nitride so that relative positions of optical components do not change even when the temperature rises during use. In contrast, the housing is typically made of a material having a relatively large coefficient of linear expansion such as copper in the light of easiness of handling and cost. Thus, when the temperature of the submount and the bottom plate of the housing lowers after the submount is fixed to the bottom plate by soldering, the bottom plate tends to bend in such a manner that the bottom plate bulges at a part near the center of the submount toward the submount owing to the bimetallic effect caused because the bottom plate has a higher contraction ratio than the submount.

As a result of study conducted by the inventors, it is found that, in a case where a laser module whose bottom plate is deformed as described above is positioned on a flat mounting surface of a heat sink and fixed thereto with screws, the power of light emitted from the laser module tends to change over time. Furthermore, as a result of intensive study conducted by the inventors, it is found that, even when the bottom plate of the laser module is flat, the same tendency is observed when the laser module is positioned on a concave mounting surface of the heat sink and fixed thereto with screws. Thus, it is found that, when the laser module is positioned on the mounting surface of the heat sink and fixed thereto with screws, the aforementioned tendency is observed when the distance between a central part of the bottom plate of the laser module and the mounting surface of the heat sink is larger than the distance between a peripheral part of the bottom plate and the mounting surface of the heat sink. In order to prevent such tendency, both of the bottom surface of the laser module and the mounting surface of the heat sink may be formed to be flat as disclosed in Patent Literature 1. It is, however, difficult to form both of the surfaces to be flat owing to problems such as manufacturing error.

An object of the present invention is therefore to provide a laser device and a laser device manufacturing method capable of minimizing a change in the power of emitted light over time.

The inventors have conducted intensive study OR the cause of the change in the power of light emitted from the laser module when the distance between the central part of the bottom plate of the laser module and the mounting surface of the heat sink is larger than the distance between the peripheral part of the bottom plate and the mounting surface of the heat sink when the laser module is positioned on the heat sink and fixed thereto with screws. As a result, the inventors have reached the following cause. When the bottom plate is bent as described above, the bottom plate is deformed by the biasing force of the screws from the state before being fixed with screws into a shape along the mounting surface of the heat sink. As a result of such deformation, the elastic force of the bottom plate itself causes stress in the direction away from the mounting surface on a part on the center side with respect to screwed positions of the bottom plate, which serve as references, and causes stress in the direction toward the mounting surface on a part outside of the screwed positions. Typically, optical components of a laser module are arranged on the central part side with respect to screwed positions of a bottom plate. Since the stress as described above is applied to the bottom plate, the bottom plate deforms over time in such a manner that the central part rises from the mounting surface of the heat sink. As a result, the relative positions of the optical components arranged on the bottom plate are changed, and the power of light emitted from the laser module changes over time as described above.

Thus, a laser device according to the present invention is a laser device including a laser module, and a heat sink on which the laser module is mounted, in which the laser module has a bottom plate fixed onto a mounting surface of the heat sink in such a manner that a peripheral part of the bottom plate is fixed to the heat sink with screws. In addition, an elastic force of the bottom plate causes stress in a direction toward the mounting surface on a central part of the bottom plate surrounded by the peripheral part.

In the laser device, since stress in the direction toward the mounting surface is applied to the central part of the bottom plate in the state in which the laser module is fixed to the heat sink, the bottom plate is subjected to deformation such that the central part moves toward the mounting surface. Such deformation, however, is prevented by the mounting surface. The bottom plate therefore hardly deforms. This allows the laser device of the present invention to minimize a change in the power of emitted light over time.

In addition, a laser device manufacturing method according to the present invention is a method for manufacturing a laser device including a laser module and a heat sink on which the laser module is mounted, and includes a positioning process of positioning a bottom plate of the laser module on a mounting surface of the heat sink; and a fixing process of fixing the bottom plate onto the mounting surface by fixing a peripheral part of the bottom plate to the heat sink with screws. In the positioning process, in a state in which the bottom plate is positioned on the mounting surface, a distance between the peripheral part and the mounting surface is larger than a distance between a central part of the bottom plate surrounded by the peripheral part and the mounting surface, and in the fixing process, a biasing force produced by the fixing with screws bends the bottom plate such that the distance between the peripheral part and the mounting surface becomes smaller than that before the fixing process.

According to the method for manufacturing a laser device as described above, a laser device in which the elastic force of the bottom plate causes stress in the direction toward the mounting surface on the central part of the bottom plate is manufactured. The manufactured laser device is thus capable of minimizing a change in the power of emitted light over time as described above.

In addition, in the laser device and in the method for manufacturing a laser device, the mounting surface preferably has a convex shape. When the mounting surface has a convex shape, the elastic force is easily applied to the bottom plate even when the bottom plate is flat.

Alternatively, in the method for manufacturing a laser device, the mounting surface, is preferably formed to be flat, and the central part of the bottom plate before the fixing process is preferably curved convexly toward the heat sink.

In this case, since the mounting surface of the heat sink on which the laser module is mounted is typically flat, the elastic force can be easily applied to the bottom plate with use of a commonly available heat sink. In addition, in the state in which the laser module is fixed to the heat sink, the bottom plate is made to be close to flat by the biasing force produced by fixing with screws. Thus, optical design such as relative positions of optical components mounted on the bottom plate is facilitated.

In addition, in the laser device, grease is preferably provided between the bottom plate and the mounting surface, and in the method for manufacturing a laser device, the bottom plate is preferably positioned on the mounting surface with grease therebetween in the positioning process.

The grease provided, between the bottom, plate and the mounting surface enables good transmission of heat from the laser module to the heat sink. Furthermore, since the distance between the peripheral part of the bottom plate and the mounting surface is larger than the distance between the central part of the bottom plate and the mounting surface after the positioning process, fixing with screws can be performed while moving unnecessary grease from the central part toward the peripheral part in the fixing process in the case where the bottom plate is positioned on the mounting surface with the grease therebetween. This allows the amount of grease present between the bottom plate and the mounting surface to be appropriate.

In addition, the laser module preferably includes a submount mounted on the bottom plate, and solder provided between the bottom plate and the submount to fix the bottom plate and the submount to each other, the solder preferably has a Young's modulus smaller than that of the bottom plate and that of the submount, and the solder is preferably thicker in the peripheral part than in the central part surrounded by the peripheral part.

In such a laser module, since the solder is thicker in the peripheral part than in the central part, the solder is more deformable in the peripheral part than in the central part. Note that, when the bottom plate fixed to the mounting surface of the heat sink is deformed by thermal stress or the like or when the bottom plate is deformed in the fixing process, the change in relative positions of the bottom plate and the submount is larger at the peripheral part than at the central part of the solder. Thus, the peripheral part of the solder is more likely to be deformed than the central part of the solder, which minimizes generation of cracks or the like.

In this case, a spacer is preferably provided on the central part of the solder.

The spacer disposed on the central part of the solder prevents the central part of the solder from being unnecessarily thick and allows the peripheral part of the solder to be thick.

Alternatively, in this case, the solder preferably has a thickness gradually increasing from the central part of the solder to the peripheral part of the solder.

With such a structure, the solder becomes thicker as the change in relative positions of the bottom plate and the submount becomes larger, which allows the solder to deform in a suitable manner.

DESCRIPTION OF EMBODIMENTS

Figure 1:
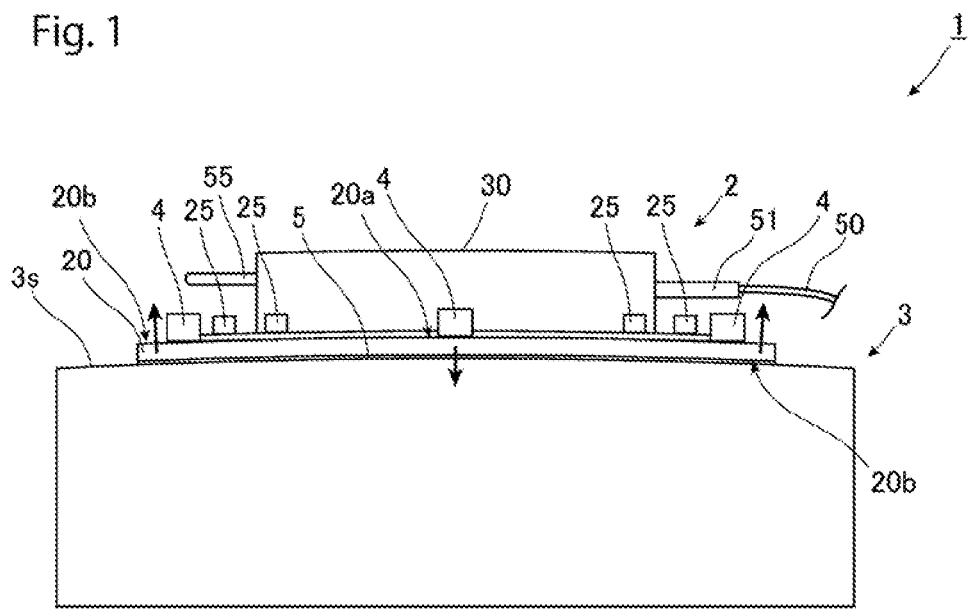
FIG. 1 is a side view illustrating a laser device according to a first embodiment of the present invention.

Preferred embodiments of a laser device and a laser device manufacturing method according to the present invention will be described in detail below with reference to the drawings. For easier understanding, a scale in the drawings may be different from that in the description below.

First Embodiment

<Laser Device>

FIG. 1 is a side view illustrating a laser device according to the present embodiment. As illustrated in FIG. 1, a laser device 1 includes, as main components, a laser module 2, and a heat sink 3.

First, the laser module will be described.

Figure 2:
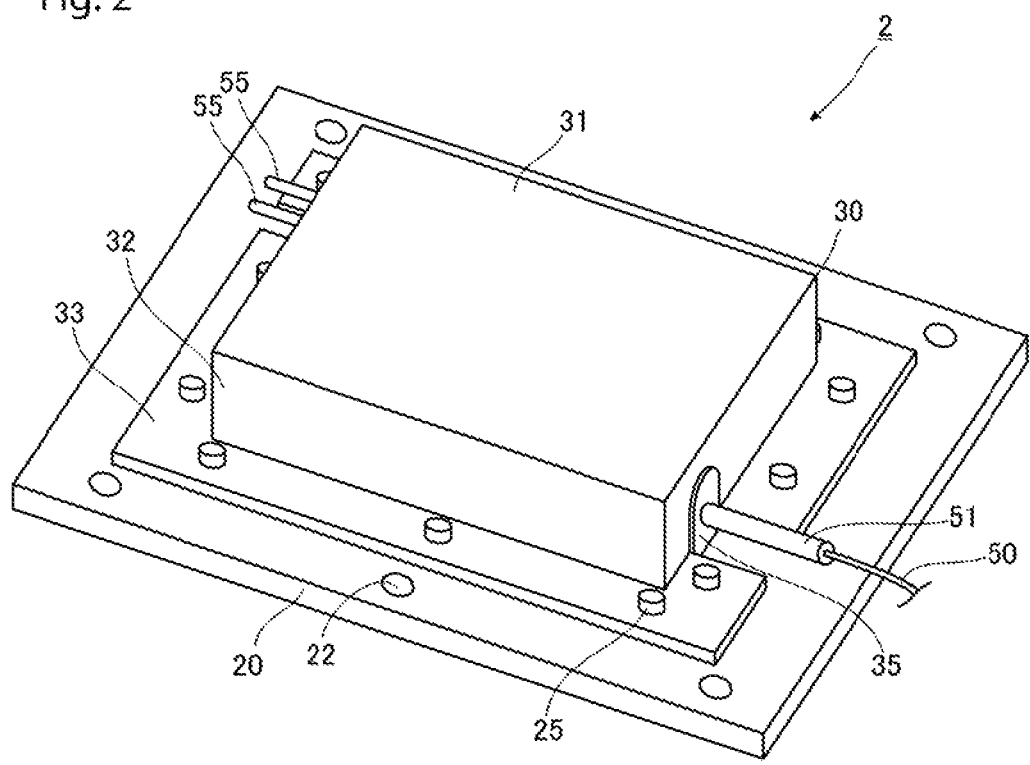
FIG. 2 is a perspective view illustrating the laser module illustrated in FIG. 1.

FIG. 2 is a perspective view illustrating the laser module 2 illustrated in FIG. 1. As illustrated in FIG. 2, the laser module 2 of the present embodiment includes a housing constituted by a base plate 20 and a cover 30, optical components, which will be described later, including an optical fiber 50 having one end fixed in the housing, and a connector 55 through which power is supplied to some of the optical components.

The cover 30 is made of a metal sheet through press working, and constituted by a top plate 31, a frame 32, and a flange 33. The top plate 31 is a part that is a top plate of the housing, and is made of a plate-like member. The frame 32 is a part connected with the edge of the top plate 31 perpendicularly to the top plate 31. In addition, the frame 32 has a cutout through which the optical fiber 50 is brought from the inside to the outside of the housing, and a cutout through which the connector 55 is brought from the inside to the outside of the housing. The flange 33 is a part connected with the frame 32 on a side opposite to the top plate 31 side of the frame 32, and extends to widen outward from the frame 32 in a direction parallel to the top plate 31. In addition, the flange 33 has a plurality of screw holes.

Figure 3:
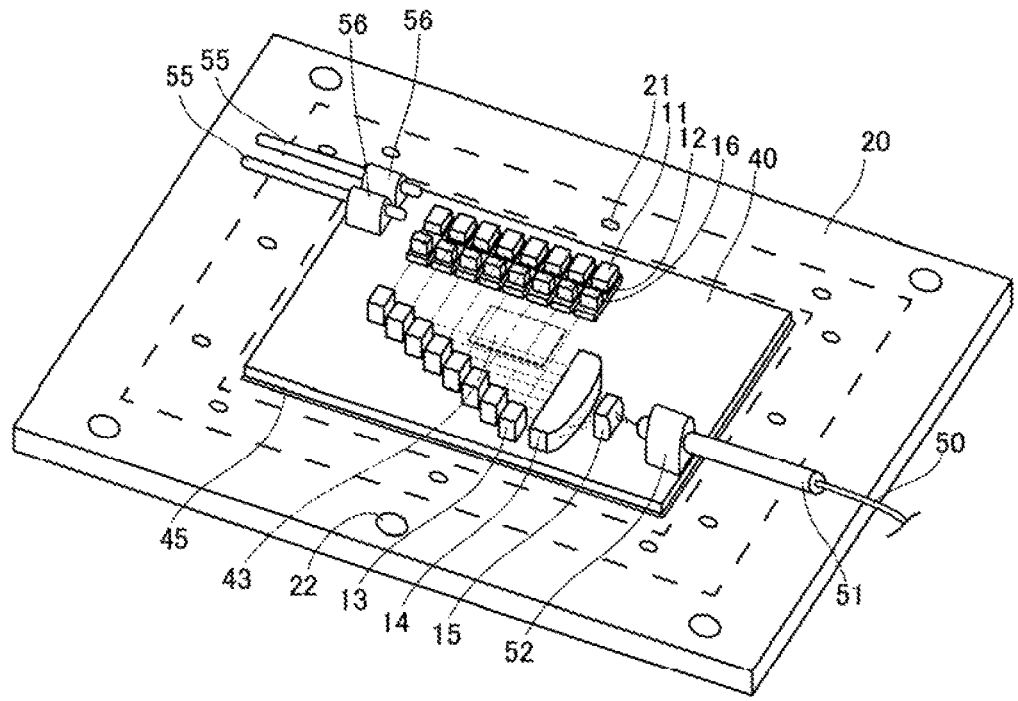
FIG. 3 is a view of the laser module illustrated in FIG. 2 without a cover.

FIG. 3 is a view of the laser module illustrated in FIG. 2 without the cover 30. Note that broken lines in FIG. 3 show states of light. Note that a broken line in FIG. 3 shows part of the base plate 20 where the flange 33 is positioned.

As illustrated in FIGS. 2 and 3, the base plate 20 is a plate having a flat bottom surface, which is a bottom plate of the housing, and made of a plate-like member in the present embodiment. The base plate 20 is made of metal, and examples of the metal of the base plate 20 include copper and stainless steel. The base plate 20 has a plurality of screw boles 21 for fixing the cover 30 with screws, and further has a plurality of screw holes 22 on the outer side of the screw holes 21. The screw holes 22 are holes for fixing the base, plate 20 to the heat sink 3 with screws.

A submount 40 is fixed on the base plate 20. The submount 40 is a plate-like board made of a material having a smaller coefficient of linear expansion than the base plate 20. For example, when the base plate 20 is made of copper, the submount 40 is made of aluminum nitride. The reason for which the submount 40 is made of such a material having a small coefficient of linear expansion is to minimize a change in the optical characteristics of laser module 2 due to expansion of the submount 40 caused by heat generated by the optical components, which are mounted on the submount 40, during use.

The optical components including the optical fiber 50 is fixed on the submount 40. The optical components of the present embodiment include laser diodes 11, collimating lenses 16, mirrors 13, a first condenser lens 14, a second condenser lens 15, and the optical fiber 50.

A plurality of laser diodes 11 constituting a light source are elements having a Fabry-Perot structure constituted by a plurality of stacked semiconductor layers, and emit laser light having a wavelength in the 900-nm band, for example. Each of the laser diodes 11 is fixed onto a laser mount 12 with solder or the like, and is fixed onto the submount 40 via the laser mount 12. The laser mounts 12 are stands for adjusting the heights of the laser diodes 11, and are each fixed to a position in the periphery of the submount 40 by soldering, for example. Note that, the laser mounts 12 may be members separate from the submount 40 and fixed onto the submount 40, or may be formed integrally with the submount 40. Alternatively, the laser mounts 12 may not be provided when the heights of the laser diodes 11 need not be adjusted.

The collimating lenses 16 are disposed on the respective laser mounts 12 of associated laser diodes 11. The collimating lenses 16 are lenses for collimating rays in the fast axis direction and rays in the slow axis direction of light emitted by the laser diodes 11, and are each typically constituted by a combination of a lens for collimating rays in the fast axis direction and a lens for collimating rays in the slow axis direction. In addition, the collimating lenses 16 are fixed with the laser diodes 11 onto the laser mount 12 by adhesion or the like. In the case where the laser mounts 12 are not provided as mentioned above, the collimating lenses 16 are fixed with the laser diodes 11 onto the submount 40.

The mirrors 13 are disposed on the submount 40 at positions associated with the respective laser diodes 11. Each of the mirrors 13 is adjusted to reflect a light ray emitted by the associated laser diode 11 and collimated by the collimating lens 16 and direct the reflected light along the surface of the submount 40 and perpendicularly to the light ray incident on the mirror 13. The mirrors 13 in the present embodiment are made of prisms, and fixed onto the submount 40 with an adhesive. Alternatively, the mirrors 13 may be made of materials other than prisms, such as a glass body having a reflective film.

The first condenser lens 14 and the second condenser lens 15 are each made of a cylindrical lens, and fixed onto the submount 40 by adhesion. The first condenser lens 14 collects the light rays reflected by the respective mirrors 13 into the fast axis direction, and the second condenser lens 15 collects the light rays emitted by the first condenser lens 14 into the slow axis direction. In this manner, the light rays emitted by the second condenser lens 15 are focused onto a predetermined position. In a case where light rays emitted from the second condenser lens 15 do not focus on a desired position, a condenser lens for collecting light emitted from the second condenser lens 15 may further be provided on the submount 40.

The optical fiber 50 is inserted through a pipe-shaped holder 51, and fixed to the holder 51. In the present embodiment, one end, which is a light input end, of the optical fiber 50 is slightly brought out from the bolder 51. The holder 51 is fixed to a fiber mount 52, and the fiber mount 52 is fixed to the submount 40. One end of the optical fiber 50 is at a position where a light ray emitted from the second condenser lens 15 enters a core. Note that, in the present embodiment, the optical fiber 50 is fixed to the holder 51 with an adhesive or solder, the holder 51 is fixed to the fiber mount 52 by adhesion, and the fiber mount 52 is fixed to the submount 40 by adhesion.

The connector 55 is made of a pair of rod-like conductors, which are respectively fixed to a pair of connector holders 56. Each of the connector holders 56 is fixed to the submount 40 by adhesion. One conductor of the connector 55 is connected with the laser diode 11 closest to the connector 55 by a gold wire, which is not illustrated, and the respective laser diodes 11 are daisy chained by gold wires, which are not illustrated. Note that the laser diode 11 farthest from the connector 55 is connected with the other conductor of the connector 55 by a gold wire, which is not illustrated.

Figure 4:
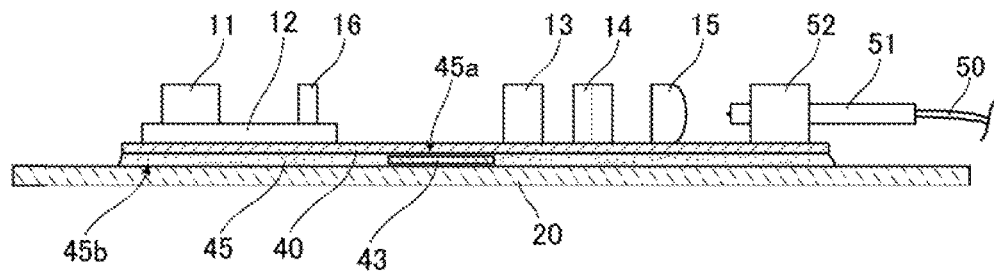
FIG. 4 is a cross-sectional view of the laser module without the cover illustrated in FIG. 3.

FIG. 4 is a cross-sectional view of the laser module without the cover illustrated in FIG. 3. Note that, for easier understanding, FIG. 4 is a cross-sectional view of FIG. 3 along an optical path of light emitted by the laser diodes 11.

As illustrated in FIGS. 3 and 4, a spacer 43 is disposed at a central part of the submount 40 between the base plate 20 and the submount 40 of the laser module 2 in the present embodiment. In the present embodiment, the central part of the submount 40 is an area including the center of the submount 40 and surrounded by an outer periphery including the outer edge of the submount 40. The submount 40 is fixed to the base plate 20 in such a manner that the entire bottom surface of the submount 40 on the base plate 20 side is soldered. Thus, the outline of the solder 45 is substantially the same as the outline of the submount 40, and the spacer 43 is provided on a central part 45a surrounded by a peripheral part 45b of the solder 45. Note that, since the laser diodes 11 are arranged at positions on the peripheral side of the submount 40 as described above, the laser diodes 11 and the spacer 43 do not overlap with each other in plan view of the submount 40 in the present embodiment.

The spacer 43 is a plate-like member having a thickness smaller than that of the solder 45 surrounding the spacer 43. In the present embodiment, the spacer 43 is fixed to the base plate 20 and the submount 40 by the solder 45 between the spacer 43 and the base plate 20 and between the spacer 43 and the submount 40, such that the base plate 20, the spacer 43, and the submount 40 are integrated. Since the spacer 43 is disposed in this manner, the solder 45 is thicker in the peripheral part 45b than in the central part 45a in which the spacer 43 is disposed.

In addition, the spacer 43 is made of metal such as iron, copper, or stainless steel, for example, preferably made of a material having a higher thermal conductivity than the solder 45, and preferably made of a material having a larger Young's modulus than the solder 45. In addition, while the spacer 43 is fixed to the base plate 20 with the solder 45 as described above, the base plate 20 and the spacer 43 may alternatively be formed integrally in such a manner that the spacer 43 is formed on the base plate 20 by machining in forming the base plate 20 in a case where the spacer 43 and the base plate 20 are made of the same material.

The submount 40 on which a plurality of optical components are arranged as described above is located in a space between the cover 30 and the base plate 20. The cover 30 is fixed to the base plate 20 as illustrated in FIG. 2 by a plurality of screws 25 threaded in the respective screw holes 21 of the base plate 20 and the screw holes formed in the flange of the cover 30. Although not particularly illustrated, silicone resin is provided between the base plate 20 and the flange 33 of the cover 30 to keep the attachment between the base plate 20 and the flange 33 airtight in the present embodiment.

In addition, in a state in which the cover 30 is provided on the base plate 20 of the housing in this manner, the holder 51 together with the optical fiber 50 is brought out through the cutout formed in the cover 30, and a bush 35 is provided between the holder 51 and the frame 32 at the cutout to fill in a gap between the holder 51 and the frame 32, as illustrated in FIG. 2. In this manner, the gap between the frame 32 and the optical fiber at the cutout is sealed by the bush 35. The bush 35 is elastically deformable at least at a part in contact with the frame 32. Such a bush 35 has a structure in which a part in contact with the frame 32, a part in contact with the base plate 20, and a part in contact with the holder 51 are made of adhesive resin composed mainly of modified silicone resin and a part surrounded by the adhesive resin is made of rigid resin such as polyether ether ketone (PEEK) resin, for example. Alternatively, the bush 35 may be entirely made of elastically-deformable resin.

In addition, in the state in which the cover 30 is provided on the base plate 20 as described above, the connector 55 is brought out through the cutout of the cover 30, and a bush, which is not illustrated, is provided between the connector 55 and the frame 32 such that a gap between the frame 32 and the connector 55 at the cutout is sealed by the bush. The bush is made of resin similar to that of the bush 35.

Next, mounting of the heat sink 3 and the laser module 2 will be explained.

As illustrated in FIG. 1, the heat sink 3 has a mounting surface 3s on which the laser module 2 is mounted. In the present embodiment, the mounting surface 3s is a convex curved surface having a larger area than the base plate 20 of the laser module 2. In addition, the mounting surface 3s has screw holes, which are not illustrated, for fixing the base plate 20. Furthermore, a cooling mechanism such as cooling-water pipes, which is not illustrated, is provided inside the heat sink 3.

In the laser device 1, the base plate 20 of the laser module 2 is disposed on the mounting surface 3s of the heat sink 3 as described above and fixed as illustrated in FIG. 1. Specifically, screws 4 are threaded into the screw holes 22 formed in a peripheral part 20b of the base plate 20 and the screw holes formed in the mounting surface 3s of the heat sink, such that the base plate 20 is fixed onto the mounting surface 3s of the heat sink 3. In this state, the bottom surface, which is a surface of the base plate 20 on the heat sink side, is along the substantially convex mounting surface 3s. Although the bottom surface of the base plate 20 is flat as described above, the base plate 20 is bent such that the bottom surface is along the mounting surface as a result of fixing of the peripheral part 20b of the base plate 20 with screws as described above. Thus, the elastic force of the base plate 20 causes stress in the direction toward the mounting surface 3s on the central part 20a of the base plate 20 and stress in the direction away from the mounting surface on the peripheral part 20b of the base plate 20 surrounding the central part 20a as shown by arrows in FIG. 1.

Note that, in the state in which the base plate 20 is fixed onto the mounting surface 3s of the heat sink 3, grease 5 is provided between the mounting surface 3s and the base plate. The grease 5 is preferably excellent in thermal conductivity. Examples of such grease include grease containing filler having a high thermal conductivity, such as Silver Ice 710NS, which is heat-resistant and highly thermally conductive grease, produced by TIMTRONICS or AS-05 produced by Arctic Silver. Such grease contains a large amount of silver filler having a high thermal conductivity, and thus typically tends to have a high viscosity. In a case where grease having a high viscosity is used between the bottom plate and the heat sink, the grease is more likely to stay on the central part 20a of the base plate 20 and prevention of deformation of the base plate over time is more facilitated than in a case where grease having a low viscosity is used.

Next, operation of the laser device 1 will be described.

In the laser module 2 of the laser device 1, when given power is supplied to the respective laser diodes 11 from the connector 55, the laser diodes 11 emit light toward the respective collimating lenses 16 associated with the respective laser diodes 11 as illustrated in FIG. 3. The light is laser light having a wavelength in the 900-nm band as described above, for example. Each of the collimating lenses 16 collimates the light emitted from the laser diode 11 and emits the collimated light. The light emitted by each of the collimating lenses 16 is incident on the associated mirror 13. Each of the mirrors 13 reflects the incident light and emits the reflected light in the direction along the surface of the base plate 20 and perpendicularly to the light incident on the mirror 13. The light rays emitted from the mirrors 13 are incident on the first condenser lens 14, which focuses the light rays in the fast axis direction. The light rays emitted from the first condenser lens 14 are incident on the second condenser lens 15, which focuses the light rays in the slow axis direction. The light rays focused by the second condenser, lens 15 are incident on the core of the optical fiber 50 and propagate through the optical fiber 50. In this manner, light is emitted from the other end of the optical fiber 50.

In this process, the laser module 2 tends to generate heat. Most of the heat is generated by the laser diodes 11. Most of the heat generated by the laser diodes 11 is transmitted to the base plate 20, which is the bottom, plate of the housing, via the submount 40 and the solder 45. The heat transmitted to the base plate 20 is transmitted to the heat sink 3 on which the base plate 20 is mounted, and the base plate 20 is thus cooled. In this process, since the grease 5 is present between the base plate 20 and the heat sink 3 as described above in the present embodiment, transmission of the heat generated by the optical components to the heat sink 3 via the base plate 20 is facilitated.

As described above, in the laser device 1 of the present embodiment, stress in the direction toward the mounting surface 3s is applied to the central part 20a of the base plate 20 in the state in which the laser module 2 is fixed to the heat sink 3. In addition, stress in the direction away from the mounting surface is applied to the peripheral part 20b of the base plate 20. Thus, the base plate 20 is subject to deformation such that the central part 20a moves toward the mounting surface 3s while the peripheral part 20b moves away from the mounting surface. Such deformation, however, is minimized by the mounting surface 3s at the central, part 20a and by the screws at the peripheral part 20b. Thus, the base plate 20 hardly deforms. This allows the laser device of the present invention to minimize a change in the power of emitted light over time.

In addition, in the present embodiment, since the mounting surface 3s of the heat sink 3 has a convex shape, an elastic force can be easily applied to the laser module 2 having a flat bottom surface. In addition, as described above, in the case where the submount 40 has a coefficient of linear expansion smaller than that of the base plate 20, soldering of the submount 40 onto the base plate 20 tends to cause the center of the base plate 20 to warp toward the submount side due to the difference in coefficient of linear expansion. Even in such a case, making the convex mounting surface 3s have a curvature larger than that of the bottom surface of the base plate 20 allows stress in the direction toward the mounting surface 3s to be applied to the central part 20a of the base plate 20.

In addition, even when the base plate 20 is positioned on the heat sink 3, the temperature of the submount 40 and the base plate 20 tends to rise owing to the heat generated by the laser diodes 11. In this case, when the submount 40 and the base plate 20 have different coefficients of linear expansion, the relative positions the submount 40 and the base plate 20 are less likely to change around the central part 45a of the solder 45 while the relative positions of the submount 40 and the base plate 20 are likely to change around the peripheral part 45b of the solder 45. In the laser module 2 of the present embodiment, however, the spacer 43 is disposed on the central part 45a such that the solder 45 is thicker in the peripheral part 45b than in the central part 45a. Thus, the solder 45 is more likely to deform at the peripheral part 45b than at the central part 45a, and deformation at the peripheral part 45b of the solder 45 having a smaller Young's modulus than the base plate 20 and the submount 40 minimizes generation of cracks in the solder 45.

In addition, since the spacer 43 is fixed to the base plate 20 and the submount 40 with the solder 45, the submount 40 and the base plate 20 are securely fixed with the spacer 43 therebetween. Furthermore, since the submount 40, the spacer 43, and the base plate 20 are connected, the thermal conductivity over the range from the submount 40 to the base plate 20 is improved as compared to a case where any of the submount 40, the spacer 43, and the base plate 20 is not connected. Thus, even when the temperature of the submount 40 rises, the heat can be easily released from the base plate 20 to the outside.

<Laser Device Manufacturing Method>

Figure 5:
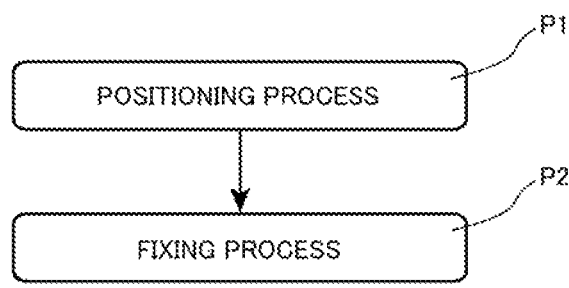
FIG. 5 is a flowchart illustrating processes of a laser device manufacturing method.

Next, a method for manufacturing the laser device illustrated in FIG. 1 will be explained. FIG. 5 is a flowchart illustrating processes of the method for manufacturing the laser device 1. As illustrated in FIG. 5, the method for manufacturing the laser device 1 of the present embodiment includes a positioning process P1 and a fixing process P2.

(Positioning Process P1)

First, the positioning process P1 is performed. This process is a process of positioning the laser module 2 on the heat sink 3.

In this process, the laser module 2 illustrated in FIGS. 2 to 4 is first provided. As described above, the bottom surface of the base plate 20 of the laser module 2 is flat. In addition, the heat sink 3 illustrated in FIG. 1 is provided. As described above, the mounting surface 3s of the heat sink 3 has a convex shape.

Subsequently, the grease 5 is applied to at least one of the bottom surface of the base plate 20 of the laser module 2 and the mounting surface 3s of the heat sink 3 as provided. The laser module 2 is then positioned on the mounting surface 3s of the heat sink 3 with the grease 5 therebetween. In this process, the screw holes 22 formed in the base plate 20 overlap with the screw holes formed in the mounting surface 3s. This positioning makes the entire base plate 20 overlap with the mounting surface 3s. In this manner, the laser module 2 is positioned on the heat sink 3 as illustrated in FIG. 6.

Figure 6:
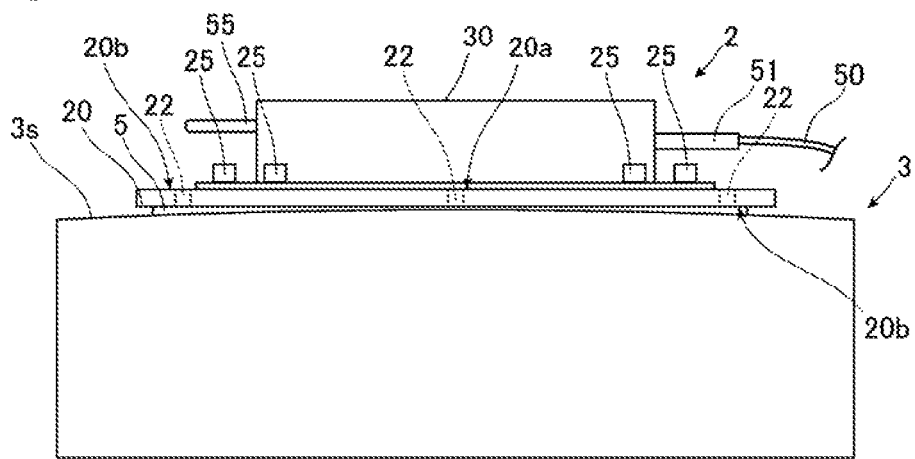
FIG. 6 is a view illustrating a state after a positioning process.

Since the bottom surface of the base plate 20 is flat while the mounting surface 3s is convex as described above, the distance between the peripheral part 20b of the base plate 20 and the mounting surface 3s is larger than the distance between the central part 20a of the base plate 20 and the mounting surface 3s in the state in which the base plate 20 is positioned on the mounting surface 3s as illustrated in FIG. 6.

(Fixing Process P2)

Subsequently, the fixing process P2 is performed. This process is a process of fixing the laser module 2 to the heat sink 3.

Figure 7:
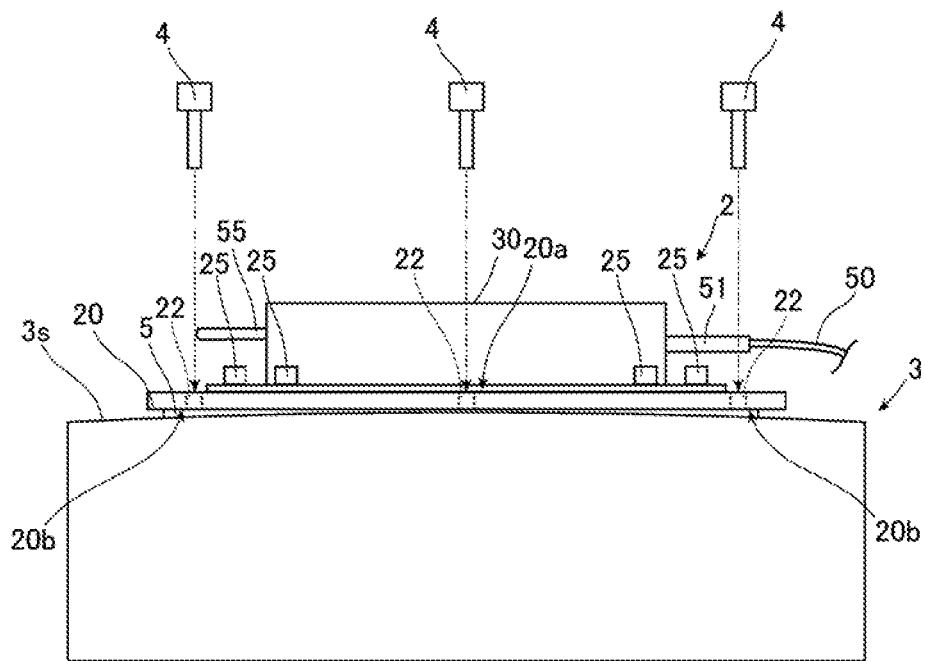
FIG. 7 is a view illustrating a state in a fixing process.

In this process, as illustrated in FIG. 7, the screws 4 are first inserted into the screw holes 22 of the base plate 20 of the laser module 2 positioned on the mounting surface 3s of the heat sink 3, and threaded into the screw holes of the heat sink 3. The screws 4 are then tightened, so that base plate 20 is bent along the mounting surface 3s. A state in which the peripheral part 20b of the base plate 20 is pressed against the mounting surface 3s by the biasing force of the screws 4 is thus achieved.

The laser device 1 illustrated in FIG. 1 is produced in this manner.

As described above, according to the method for manufacturing the laser device 1 of the present embodiment, a laser device in which the elastic force of the base plate 20 causes stress in the direction toward the mounting surface 3s on the central part 28a of the base plate 20 is manufactured. The manufactured laser device 1 is thus capable of minimizing a change in the power of emitted light over time as described above.

In addition, since the mounting surface 3s has a convex shape, the elastic force can be easily applied to the base plate 20 even when a typical laser module 2 with a base plate 20 having a flat bottom surface is used.

Furthermore, since the distance between the peripheral part 20b of the base plate 20 and the mounting surface 3s is larger than the distance between the central part 20a of the base plate 20 and the mounting surface 3s after the positioning process P1, fixing with screws can be performed while moving unnecessary grease 5 front the central part 20a side toward the peripheral, part 20b in the fixing process P2.

This allows the amount of grease 5 present between the base plate 20 and the mounting surface 3s to be appropriate.

In addition, when the base plate 20 deforms in the fixing process P2 the change in relative positions of the base plate 20 and the submount 40 is larger at the peripheral part 45b of the solder 45 than at the central part 45a of the solder 45. In the present embodiment, however, the thickness of the peripheral part 45b of the solder 45 is larger than that of the central part 45a of the solder 45 in the laser module 2, and the peripheral part 45b of the solder 45 is more likely to be deformed than the central part 45a, which minimizes generation of cracks or the like in the solder 45.

Second Embodiment

Next, a second embodiment of the present invention will be described in detail with reference to FIG. 8. Here, components that are identical or similar to those in the first embodiment are designated by the same reference numerals and redundant description will not be repeated unless otherwise particularly described.

Figure 8:
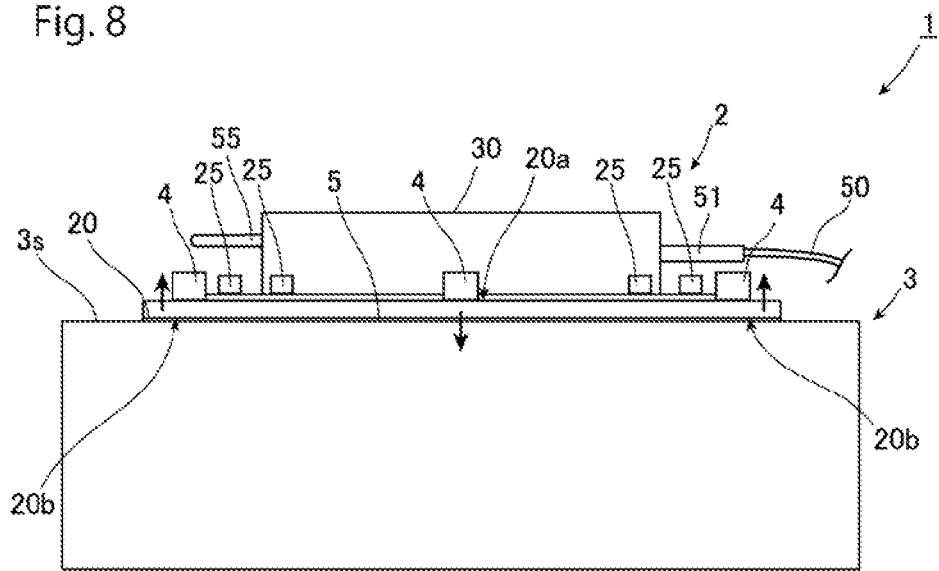
FIG. 8 is a view illustrating a laser device according to a second embodiment of the present invention.

FIG. 8 is a view of a laser device according to the present embodiment illustrated in the same manner as in FIG. 1. As illustrated in FIG. 8, the laser device 1 of the present embodiment is different from the laser device 1 of the first embodiment in that the mounting surface 3s of the heat sink 3 is flat.

In the present embodiment as well, however, the elastic force of the base plate 20 causes stress in the direction toward the mounting surface 3s on the central part 20a of the base plate 20 and stress in the direction away from the mounting surface 3s on the peripheral part 20b of the base plate 20 surrounding the central part 20a as illustrated in FIG. 8, similarly to the laser device 1 of the first embodiment.

Next, a method for manufacturing the laser device 1 of the present embodiment will be explained.

The method for manufacturing the laser device 1 of the present, embodiment includes a positioning process P1 and a fixing process P2 similarly to the method for manufacturing the laser device 1 of the first embodiment.

(Positioning Process P1)

Figure 9:
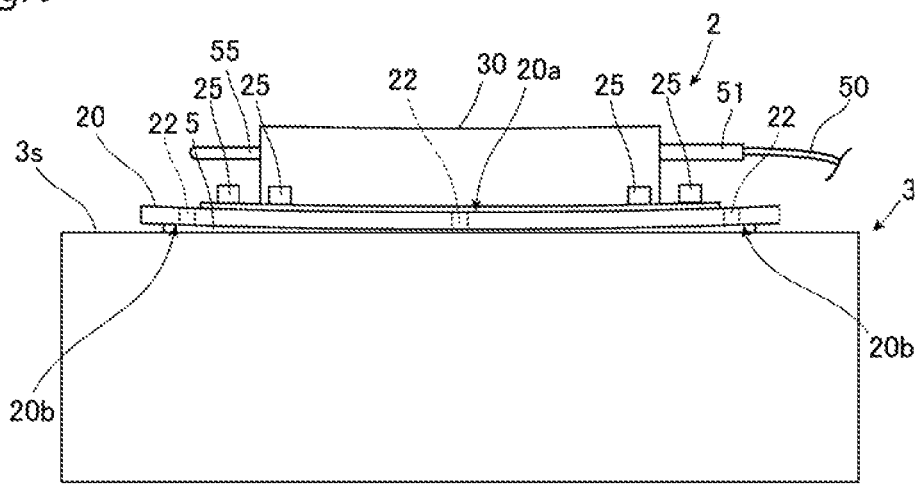
FIG. 9 is a view illustrating a state after a positioning process.

FIG. 9 is a view illustrating a state after the present process. As illustrated in FIG. 9, the laser module 2 provided in the present embodiment is different from the laser module 2 of the first embodiment in that the base plate 20 is convex outward, that is, toward the heat sink 3 side. In addition, the heat sink 3 provided in the present embodiment is different from the heat sink 3 of the first embodiment in that the mounting surface 3s is flat.

Next, similarly to the positioning process P1 of the first embodiment, the grease 5 is applied to at least one of the bottom surface of the base plate 20 of the laser module 2 and the mounting surface 3s of the heat sink 3, and the laser module 2 is positioned on the mounting surface 3s of the heat sink 3. In this manner, the laser module 2 is positioned on the heat sink 3 as illustrated in FIG. 8.

In the present embodiment, Since the bottom surface of the base plate 20 is convex while the mounting surface 3s is flat as described above, the distance between the peripheral part 20b of the base plate 20 and the mounting surface 3s is larger than the distance between the central part 20a of the base plate 20 and the mounting surface 3s in the state in which the base plate 20 is positioned on the mounting surface 3s as illustrated in FIG. 8.

(Fixing Process P2)

Subsequently, the fixing process P2 is performed similarly to the first embodiment.

Figure 10:
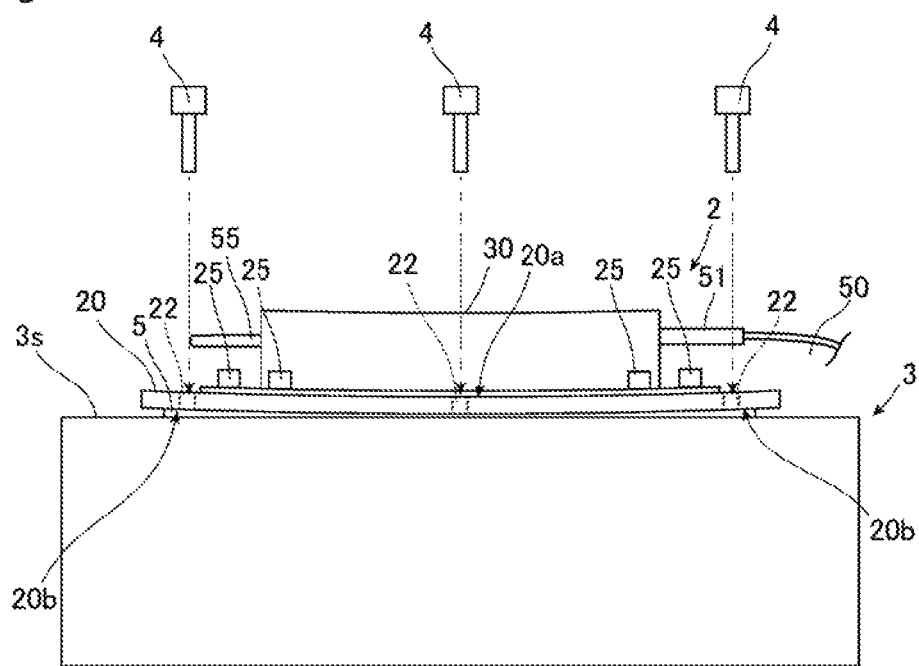
FIG. 10 is a view illustrating a state in a fixing process.

FIG. 10 is a view illustrating a state in the present process. In the present embodiment, similarly to the first embodiment, since the peripheral part 20b of the base plate 20 and the mounting surface 3s are separated from each other before the fixing process P2, the screws 4 are tightened such that the base plate 20 is bent along the mounting surface 3s. A state in which the peripheral part 20b of the base plate 20 is pressed against the mounting surface 3s by the biasing force of the screws 4 is thus achieved.

The laser device 1 illustrated in FIG. 8 is produced in this manner.

As described above, in the present embodiment, the mounting surface 3s is formed to foe flat, and the base plate 20 before the fixing process P2 is curved so that the central part 20a is convexed toward the heat sink 3. Thus, according to the method for manufacturing the laser device 1 of the present embodiment, an elastic force can be easily applied to the base plate 20 with use of a commonly available heat sink having a flat mounting surface. In addition, in the state in which the laser module 2 is fixed to the heat sink 3, the base plate is made to be close to flat by the biasing force produced by fixing with screws. Thus, optical design such as relative positions of optical components mounted on the base plate is facilitated.

While the present invention has been described above by reference to the embodiments as examples, the present invention is not limited thereto.

For example, the base plate 20 of the laser module 2 provided in the positioning process P1 has a flat bottom surface in the first embodiment. In addition, the base plate 20 of the laser module 2 provided in the positioning process P1 has a convex bottom surface in the second embodiment. In the present invention however, it is only necessary that the distance between the peripheral part 20b of the base plate 20 and the mounting surface 3s is larger than the distance between the central part 20a of the base plate 20 and the mounting surface 3s in the state in which the base plate 20 is positioned on the mounting surface 3s in the positioning process P1. Thus, as long as this condition is satisfied, the bottom surface of the base plate 20 of the laser module 2 provided in the positioning process P1 of the first embodiment may be curved or the bottom surface of the base plate 20 of the laser module 2 provided in the positioning process P1 of the second embodiment may be curved in a manner different from that in the second embodiment.

In addition, while the laser module 2 has the submount 40 in the embodiments described above, the submount 40 is pot essential. Furthermore, in a structure in which the submount 40 is provided, the spacer 43 is not essential. In other words, even when the laser module 2 includes the submount 40, the feature that the solder 45 is thicker in the peripheral part 45b than in the central part 45a is not essential. In terms of minimizing cracks generated in the solder, however, in a case where the submount 40 is provided, the solder 45 preferably has a Young's modulus smaller than that of the base plate 20 and that of the submount 40 and the solder 45 is thicker in the peripheral part 45b than in the central part.

Figure 11:
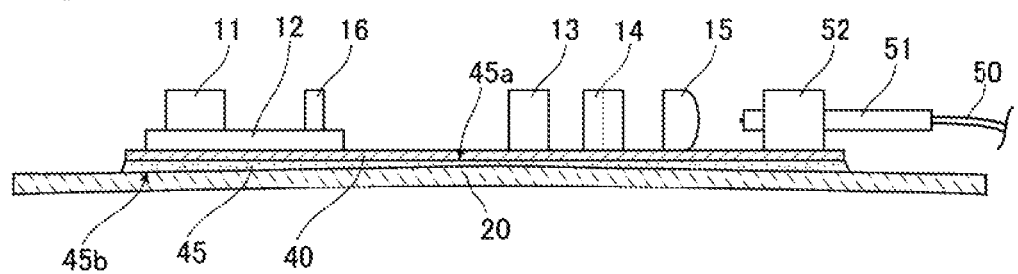
FIG. 11 is a view illustrating a modification of the laser module similarly to FIG. 4.

FIG. 11 is a view illustrating, similarly to FIG. 4, a modification of a laser module in which the solder 45 is thicker in the peripheral part 45b than in the central part. Note that, for explanation of the modification, components that are identical or equivalent to those in the first embodiment will be designated by the same reference numerals and redundant description will not be repeated unless otherwise particularly described. As illustrated in FIG. 11, no spacer 43 is provided between the base plate 20 and the submount 40 in the modification. Thus, in the present embodiment, the entire bottom surface of the submount 40 facing the base plate 20 is fixed to the base plate 20 with the solder 45. In this state, the base plate 20 is slightly warped in such a manner that the base plate 20 bulges at a part near the center of the submount 40 toward the submount 40. Thus, the solder 45 is thicker in the peripheral part 45b than in the central part 45a, and the thickness of the solder 45 gradually increases from the central part 45a to the peripheral part 45b. The amount of change in relative positions of the base plate 20 and the submount 40 due to heat generated by the laser module 2 and mounting of the laser module 2 on the heat sink 3 gradually increases from the central part 45a of the solder 45 to the peripheral part 45b of the solder 45. Thus, the thickness of the solder 45 gradually increasing from the central part 45a to the peripheral part 45b of the solder as in the modification allows the deformability of the solder 45 to increase with the amount of change in relative positions of the base plate 20 and the submount 40. Use of the laser module of the modification allows the solder 45 to deform in a suitable manner.

In addition, while the grease 5 is provided between the laser module 2 and the heat sink 3 in the embodiments described above, the grease 5 is not essential. In terms of good transmission of heat from the laser module 2 to the heat sink 3, however, it is preferable that the grease 5 be provided.

As described above, a laser device according to the present invention can be used in the field of fiber laser devices, for example.

REFERENCE SIGNS LIST

1 . . . laser device
2 . . . laser module
3 . . . heat sink
4 . . . screw
5 . . . grease
20 . . . base plate
30 . . . cover
40 . . . submount
43 . . . spacer
45 . . . solder
50 . . . optical fiber
P1 . . . positioning process
P2 . . . fixing process

The invention claimed is:

1. A laser device comprising a laser module, and a heat sink on which the laser module is mounted, wherein
the laser module has a bottom plate fixed onto a mounting surface of the heat sink in such a manner that a peripheral part of the bottom plate is fixed to the heat sink with screws, and
an elastic force of the bottom plate causes stress in a direction toward the mounting surface on a central part of the bottom plate surrounded by the peripheral part, wherein
the laser module includes a submount mounted on the bottom plate, and solder provided between the bottom plate and the submount to fix the bottom plate and the submount to each other,
the solder has a Young's modulus smaller than that of the bottom plate and that of the submount,
the solder is thicker in the peripheral part than in the central part surrounded by the peripheral part,
a spacer is provided between the bottom plate and the submount and is provided in the central part of the solder such that the spacer is surrounded by the peripheral part of the solder, and
the spacer has a thickness smaller than that of the peripheral part of the solder.

2. The laser device according to claim 1, wherein the mounting surface has a convex shape.

3. The laser device according to claim 1, wherein grease is provided between the bottom plate and the mounting surface.

4. The laser device according to claim 1, wherein the solder has a thickness gradually increasing from the central part of the solder to the peripheral part of the solder.

5. A method for manufacturing a laser device including a laser module and a heat sink on which the laser module is mounted, the method comprising:
a positioning process of positioning a bottom plate of the laser module on a mounting surface of the heat sink; and
a fixing process of fixing the bottom plate onto the mounting surface by fixing a peripheral part of the bottom plate to the heat sink with screws, wherein
in the positioning process, in a state in which the bottom plate is positioned on the mounting surface, a distance between the peripheral part and the mounting surface is larger than a distance between a central part of the bottom plate surrounded by the peripheral part and the mounting surface, and
in the fixing process, a biasing force produced by the fixing with screws bends the bottom plate such that the distance between the peripheral part and the mounting surface becomes smaller than that before the fixing process,
wherein
the laser module includes a submount mounted on the bottom plate, and solder provided between the bottom plate and the submount to fix the bottom plate and the submount to each other,
the solder has a Young's modulus smaller than that of the bottom plate and that of the submount,
the solder is thicker in the peripheral part than in the central part surrounded by the peripheral part,
a spacer is provided between the bottom plate and the submount and is provided in the central part of the solder such that the spacer is surrounded by the peripheral part of the solder, and
the spacer has a thickness smaller than that of the peripheral part of the solder.

6. The method for manufacturing a laser device according to claim 5, wherein the mounting surface has a convex shape.

7. The method for manufacturing a laser device according to claim 5, wherein
the mounting surface is formed to be flat, and
the central part of the bottom plate before the fixing process is curved convexly toward the heat sink.

8. The method for manufacturing a laser device according to claim 5, wherein in the positioning process, the bottom plate is positioned on the mounting surface with grease therebetween.

9. The method for manufacturing a laser device according to claim 5, wherein the solder has a thickness gradually increasing from the central part of the solder to the peripheral part of the solder.

* * * * *